United States Patent [19]
Gerna et al.

[11] Patent Number: 5,805,492
[45] Date of Patent: Sep. 8, 1998

[54] ANALOG MEMORY FOR STORING A QCIF IMAGE OR THE LIKE AS ELECTRIC CHARGE

[75] Inventors: Danilo Gerna, Montagna; Marco Pasotti, Martino Siccomario; Stefano Marchese, Pavia, all of Italy

[73] Assignee: SGS-Thomson Microelectronics, S.r.l., Agrate Brianza, Italy

[21] Appl. No.: 722,572

[22] Filed: Sep. 27, 1996

[30] Foreign Application Priority Data

Sep. 27, 1995 [EP] European Pat. Off. .............. 95830397

[51] Int. Cl.$^6$ ............................ G11C 27/00; G11C 11/24; G11C 11/36
[52] U.S. Cl. .............................. 365/45; 365/149; 365/115
[58] Field of Search ................... 365/45, 64, 106, 365/112, 114, 115, 183, 149

[56] References Cited

U.S. PATENT DOCUMENTS

| | | | |
|---|---|---|---|
| 4,164,023 | 8/1979 | Whitehouse et al. | 365/45 |
| 5,625,583 | 4/1997 | Hyatt | 365/45 |

FOREIGN PATENT DOCUMENTS

| | | |
|---|---|---|
| 0317236 | 5/1989 | European Pat. Off. . |

OTHER PUBLICATIONS

Callewaert et al., "Front end and signal processing electronics for large detectors," IEEE Transactions on Nuclear Science, vol. 36, No. 1, 9, New York, pp. 446–457.

Franchi et al., "Random Access Analog Memory for Early Vision," IEEE Journal of Solid–State Circuits, vol. 27, No. 7, July 1, 1992, pp. 1105–1109.

*Primary Examiner*—David C. Nelms
*Assistant Examiner*—Trong Phan
*Attorney, Agent, or Firm*—Robert Groover; Matthew Anderson; Betty Formby

[57] ABSTRACT

The speed of a capacitive cell RAAM used for storing an optical image as electric charge is greatly enhanced by presampling the serial analog input signal on two rows or lines of presampling capacitors, each composed of the same number of capacitors as the number of columns of the capacitive cell RAAM and by "writing" in a parallel mode the selected row of said memory. The values stored in the capacitors of one of said two presampling rows are transferred (written) in the corresponding cells of the selected row of the memory while presampling continues on the other row of presampling capacitors.

33 Claims, 6 Drawing Sheets

ANALOG MEMORY FOR STORING A QCIF IMAGE OR THE LIKE AS ELECTRIC CHARGE

CROSS-REFERENCE TO RELATED APPLICATION

This application claims priority from EP 95830397.6, filed Sep. 27, 1995, which is hereby incorporated by reference. However, the content of the present application is not necessarily identical to that of the priority application.

BACKGROUND AND SUMMARY OF THE INVENTION

The present invention relates to a storing analog device (buffer) for fast analog signal frames. The device is particularly suitable for early vision processing in neural networks, as an intelligent sensor for the transmission of images on ISDN (Integrated Services Digital Networks) networks, in intelligent motion sensors and in other similar systems.

A novel and important frontier in the development of analog signal processing systems consists in realizing high density algorithms that do not require high precision; this with an aim of using analog circuits rather than digital circuits for improving performances.

A possible application of this technique is the use of analog circuits for solving computational requirements of an intelligent visual sensing device (early vision processing), in order to realize, for example, an intelligent motion sensor. An appropriate solution of the technical and technological problems of such systems would be to integrate on the same chip both the photosensor and the processing circuit required to fulfill the most compelling requirements of miniaturization of such structures.

An important function of the implemented algorithms is the estimate of the motion vectors. This type of processing requires a high computational parallelism that, if realized by exclusively employing digital circuits, would require a remarkable area of integration. Typically the algorithm that estimates the motion vectors requires the realization of four fundamental blocks: an array of photodiodes, a computational array for estimating the motion, and two memories for realizing a raster or frame of the current image and of the preceding image, respectively. Due to the fact that the computational array requires an analog input signal, the use of conventional digital memories requires a digital-analog converter. Instead, by employing an analog memory, the analog signal to be supplied to the computational array would be directly available from the memory.

The article entitled "Random Access Analog Memory for Early Vision" by Eleonora Franchi, Marco Tartagni, Roberto Guerrieri and Giorgio Baccarani (University of Bologna), published on the IEEE Journal Solid-State Circuits, Vol. 37, No. 7, July 1992, which is hereby incorporated by reference, describes the realization of an analog memory realized according to the CMOS technology with a line width of 1.6 micrometers and constituted by 176×144 capacitive cells. The random access analog memory (RAAM) used has a charge retention time sufficiently long to satisfy the minimum requirement of retention of $1/30^{th}$ of a second for each frame. During this retention period, the memory can be read several times without destroying the information, according to the requirements of the computational algorithm. The writing of the cells takes place by activating all the cells of one line of the array at the same time, while the columns of the array are activated sequentially in accordance with the arrangement of the input data that are usually supplied by a line by line scanning system of an image.

In well known capacitive cell analog memories (RAAM), the writing of data in the memory occurs in a sequential mode. The analog input is serial and is stored in the selected capacitive cell of the memory array each time said analog serial signal is present at the input. This situation limits the writing speed and is also incompatible with an hypothesis of implementing a parallel transfer of data coming from a corresponding (176×144) matrix of photodiodes.

According to the present invention, the performance of an analog memory of capacitive cells (RAAM) in terms of speed and energy consumption, can be remarkably improved by introducing a presampling of the input analog signal on two presampling lines or rows or arrays of capacitors, with the number of capacitors equal to the number of columns of the memory cells of the matrix, and by writing in parallel all the cells of an entire row of the memory matrix, transferring in them the charge presampled stored in the respective presampling capacitors of one of said two lines, while the input analog serial signal continues to be presampled on the other row of presampling capacitors. In practice, one row or array of presampling capacitors is used for writing even numbered rows of the memory and the other presampling row is used for writing odd numbered rows of the memory.

According to another important aspect of this invention, the transfer of the charge from one presampling capacitor to the corresponding capacitive cell of the memory matrix, during a writing phase of an entire row of cells in a parallel way, is carried out by way of an integrating stage (amplifier), preferably constituted by a single branch cascode circuit, having an integrating capacitor feedback. In this way, current absorption is greatly reduced if compared to the use of a common buffer stage instead of an integrator.

Of course, the memory can have a parallel output of eight or more channels.

According to the invention, the analog memory writing speed is limited in practice only by the time necessary for presampling an analog signal on the input presampling capacitors and therefore can be very high.

In many applications, this architecture of a capacitive cell analog memory can allow a parallel transfer of data coming from a corresponding matrix of photodiodes with a further increment of the system speed.

The increased speed of the storing system promotes size reduction of the device through the use of more advanced fabrication technologies, for enhanced integration of the entire system on a single chip.

BRIEF DESCRIPTION OF THE DRAWING

The disclosed inventions will be described with reference to the accompanying drawings, which show important sample embodiments of the invention and which are incorporated in the specification hereof by reference, wherein.

DETAILED DESCRIPTION OF THE PREFERRED EMBODIMENTS

The numerous innovative teachings of the present application will be described with particular reference to the presently preferred embodiment (by way of example, and not of limitation), in which:

In order to verify the effectiveness of the novel architecture object of the present invention, a random access analog memory with dimensions: 176 (columns) by 144 (lines), capable of managing the corresponding 176×144 pixels of an image frame in a QCIF (Quarter Common Interface Format) format has been realized. By way of example, the computational algorithm used (H262) establishes as appropriate a precision of 6 bits, whereas the real time operating requirement of the system requires an ability of storing an image (frame) for a minimum retention time of $\frac{1}{15}^{th}$ of a second, during which each capacitive cell of the RAAM may be read five times.

The memory was realized in CMOS technology with a line width of 0.7 micrometers.

Figure 1:
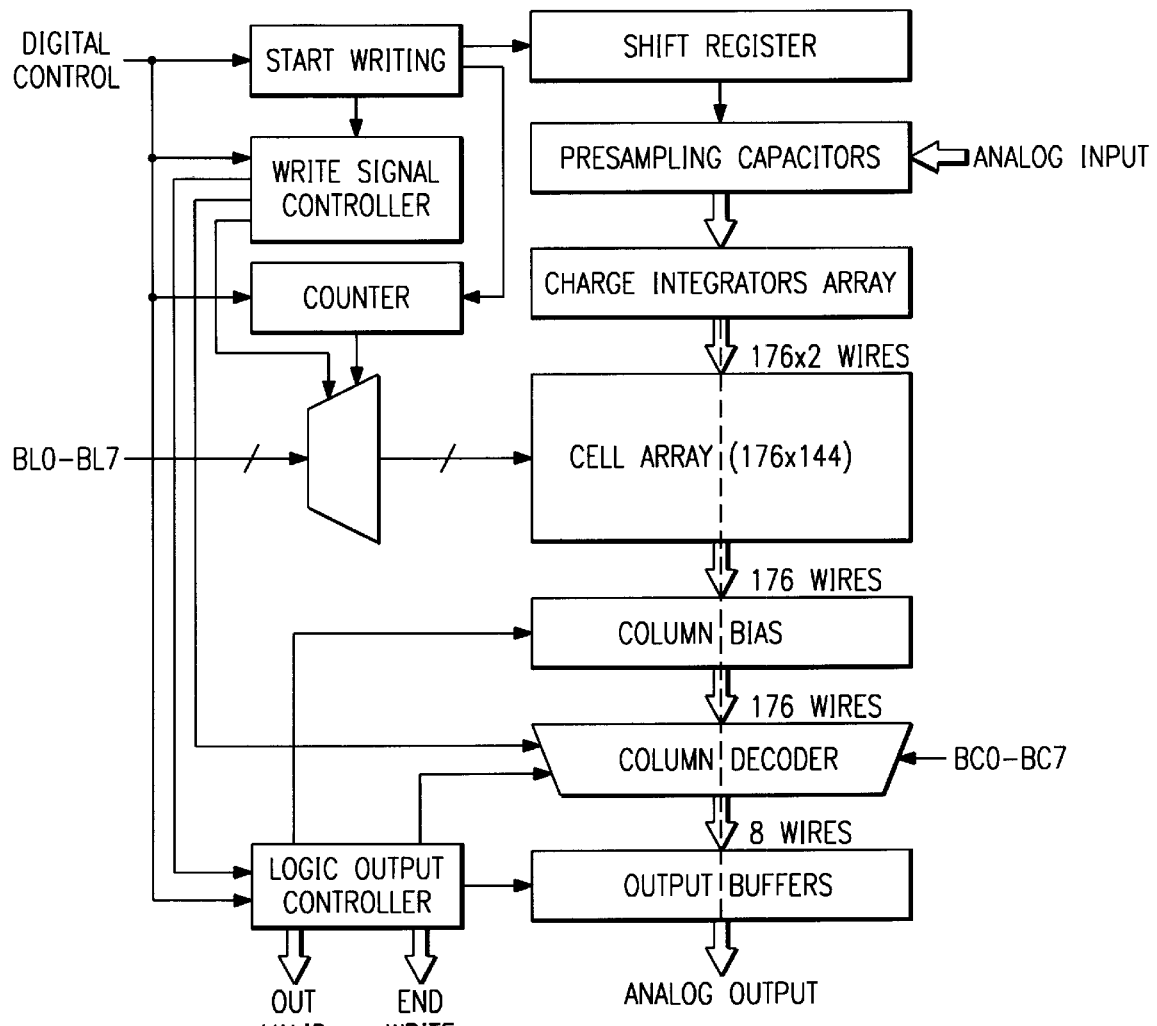
FIG. 1 is a high-level block diagram of a RAAM realized according to the invention.

A high-level block diagram of the memory device is shown in FIG. 1.

The depicted memory has a serial input and a parallel output. During a reading phase the memory provides at its output the analog values of eight adjacent cells belonging to one preselected row. The DIGITAL CONTROL input feeds the start writing circuitry 101, the write signal controller circuitry 105, the counter circuitry 111, and logic output controller circuitry 121. The start writing circuitry 101 also connects to the counter 111 and shift register 103. The write signal controller 105 connects to circuit 123, columns decoder 117, and logic output controller 121. The shift register 103 passes data to the presampling capacitors 107. The presampling capacitors 107 receives analog inputs and also connects to the charge integrators array 109. The cell array 113 receives signals from the charge integrators array 109 and also from circuit 123. Columns bias circuitry 115 receives signals from both the cell array 113 and the logic output controller 121. The columns decoder 117 receives signals from the columns bias circuitry 115 and passes signals to the output buffers 119. The output buffers 119 receive signals from the logic output controller 121 and also provide a parallel analog output path.

Figure 2:
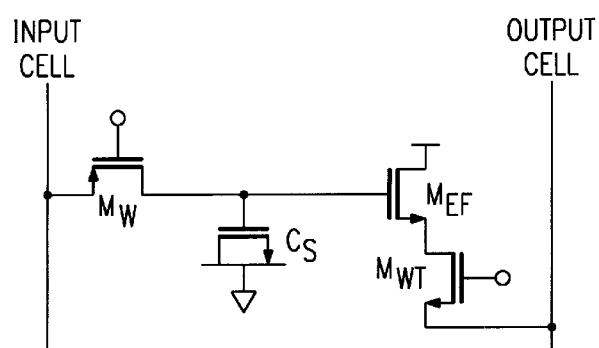
FIG. 2 illustrates the electric scheme of a single cell of the memory matrix.

FIG. 2 illustrates the electric scheme of a single memory cell. The storing capacitor, in which electric charge, for example the electric charge corresponding to the current photogenerated by a photoconductive diode of a QCIF sensor is stored, is realized in the form of an MOS capacitor structure $C_s$.

The MOS transistor $M_w$ constitutes the cell's select switch for the writing of the cell, the MOS transistor $M_{wr}$ constitutes a second select switch of the cell, used during both the writing and the reading phases. The switch $M_{ef}$ constitutes a decoupling switch of the capacitance $C_s$ during the reading phase in order to avoid destruction of the information stored in the capacitive cell $C_s$ during the repeated readings that take place within the retention interval of the current frame.

Leakage currents flowing through the hu +/Nwell junction of the drain region of the transistor $M_w$ degrade the information stored on $C_s$ in the form of an electric charge according to the following expression:

$$Erv = (I_{leakage}/C_s) T_{storage} (\text{volts})$$

As can be seen, a high capacitance value of $C_s$ reduces this degradation mechanism.

The opening of the "write" switch, that is the switching off of the MOS transistor $M_w$, causes the integration in the capacitance $C_s$ of a so-called "clockfeedthrough" electric charge whose value can vary from cell to cell, thus introducing an error in the analog value stored in the capacitance $C_s$. Even in this case, the error can be reduced by increasing the value of the capacitance $C_s$.

Therefore, an attendant objective is that of designing a cell in such a way as to maximize the value of the capacitance $C_s$ while fulfilling the specified maximum dimensions of the cell.

Figure 3:
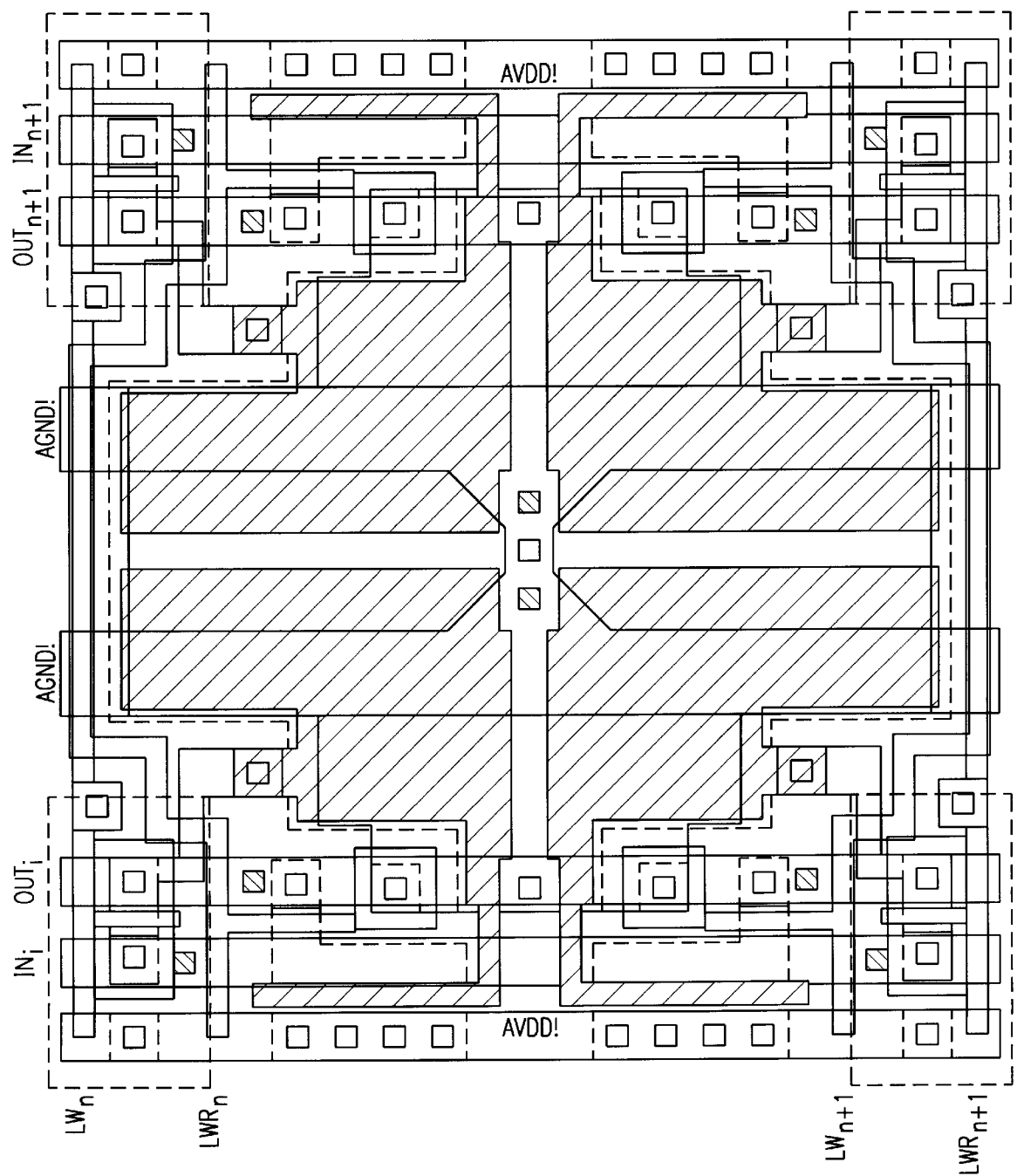
FIG. 3 is a layout of a single memory cell.

FIG. 3 is the layout of a RAAM cell. The dimensions of the unit cell are 22 micrometers by 21.2 micrometers. The shaded area represents the area of the capacitor $C_s$. The write and read/write lines, $Lw_n(Lw_{n+1})$ and $Lwr_n(Lwr_{n+1})$, respectively, are shown in the layout. Additionally, the ground AGND! and supply voltage AVDD! areas are shown. Input and outputs, $IN_i(IN_{i+1})$ and $OUT_i(OUT_{i+1})$, respectively, are also shown for the RAAM memory cell.

The reading of the state of charge of the capacitive cells $C_s$ occurs via the read amplifier $M_{ef}$, which is enabled by the switch $M_{wr}$, in a substantially non-destructive way, of the information stored in the form of an electric charge in the capacitor $C_s$.

By referring to the block diagram of FIG. 1, according to the present invention, the analog input signal is presampled on two lines or rows of presampling capacitors. Each line or row being constituted by a number of presampling capacitors is equal to the number (176) of the matrix columns. Writing of the analog memory occurs by whole selected rows of cells, by transferring in a parallel way the electric charges stored in the presampling capacitors, of one of the two lines or rows, into the memory cells of the selected row of the addressable memory matrix. At the same time, the presampling of the analog input signal continues to be carried out on the other line or row of presampling capacitors, whose charge levels will be subsequently transferred in the successively selected row of memory cells of the matrix and so forth.

Figure 4:
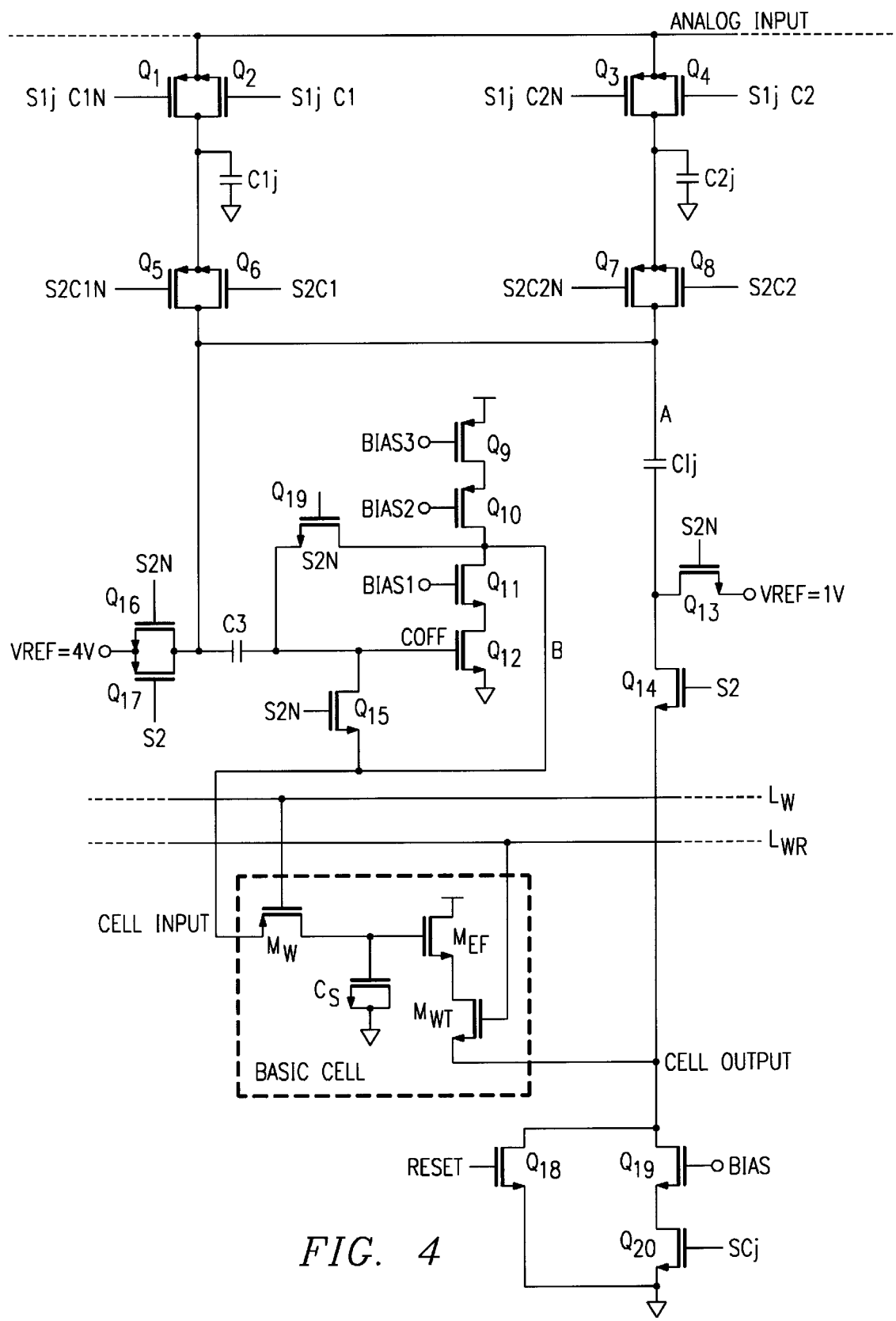
FIG. 4 is an electric diagram of the writing circuit of a memory cell according to the invention.

The architecture of the writing system, according to a preferred embodiment of the invention, is shown in FIG. 4.

Each column of the matrix is substantially independent from the others. In FIG. 4 only one cell of a column is depicted, but in the case considered above, there exist 144 similar cells for each column. The reading of any of the selected cells of the column is carried into effect via a unique reading amplifier, as will be described in more detail below.

Each memory cell is selected by closing the switches $M_w$, and $M_{wr}$. Only one cell per column can be selected at any one time.

The labels used in FIG. 4 indicate the following.

| | |
|---|---|
| n index | Indicates the progressive number of the rows of the memory matrix. |
| j index | Indicates the progressive number of the columns of memory matrix. Where the index J is not present, this means that the logic signal is common for the entire memory and, if only the index n is present, this means that the logic signal is common only for all the cells of a single row of the matrix. |
| N | When shown, it indicates that the logic signal is inverted. |
| C1$_j$, C2$_j$ | Indicate the presampling capacitors. |
| C1$_j$ | Indicates an integrating capacitor. |
| Coff$_j$ | Indicates an offset compensation capacitor. |
| SC$_j$ | Indicates a column select transistor. This transistor serves for biasing the column. |
| L$_{wn}$ | Active when in a low logic state; it attends to the selection of a cell during a writing phase. |
| L$_{wkn}$ | Active when in a high logic state; it attends to the selection of a cell during both a writing phase and a reading phase. |

The "cell input" and the "cell output" wires of the diagram of FIG. 4 represent the 176×2 wires coming from the amplifier array, i.e., of the array of charge integrators of the diagram of FIG. 1.

The integrating stage (amplifier) used for writing the memory cells of the respective column of the matrix is constituted by a single branch cascode stage, realized by an integrating capacitor $CI_j$. The amplifier's input is selectively driven by the electric charge stored in either one or the other presampling capacitor, $C1_j$, $C2_j$, each of which belongs respectively to one of the two lines or rows of 176 presampling capacitors of the serial analog input signal (analog input). Transistor pairs Q1/Q2 and Q3/Q4 each receive the analog input. Logic signal $S1_jC1N$ drives transistor Q1 and logic signal $S1_jC1$ drives transistor Q2. Logic signal $S1_jC2N$ drives transistor Q3 and logic signal $S1_jC2$ drives transistor Q4. Transistor pair Q1/Q2 connect to transistor pair Q5/Q6. Transistor pair Q3/Q4 connect to transistor pair Q7/Q8. Presampling capacitor $C1_j$ connects between transistor pairs Q1/Q2 and Q5/Q6, to ground. Presampling capacitor $C2_j$ connects between transistor pairs Q3/Q4 and Q7/Q8, to ground. The outputs of transistor pairs Q5/Q6 and Q7/Q8 are tied together. Additionally, the output of transistor pair Q5/Q6 is connected to the output of transistor pair Q16/Q17. The input of transistor pair Q16/Q17 receives VREF=4 V. The output of transistor pair Q16/Q17 is connected to transistors Q19, Q15, and the gate of Q12 (Coff), through capacitor C3. The output of Q12 is grounded. Logic signal S2N drives both transistors Q15 and Q19. The input if Q9 is connected to supply, while the output of Q9 is connected to the input of Q10. The output of Q10 is connected to the input of Q11, the input of Q19, the output of Q15 and the input of MW. Signal BIAS3 drives transistor Q9, signal BIAS2 drives transistor Q10, and signal BIAS1 drives transistor Q11.

The output of transistor pair Q7/Q8 is also connected to transistors Q13 and Q14 through integrating capacitor $CI_j$. Logic signal S2N drives the gate of transistor Q13. Logic signal S2 drives the gate of transistor Q14. The input to transistor Q13 is VREF=1 V. The output of transistor Q14 connects to transistors $M_{wr}$, Q19, and Q18. Logic Signal BIAS drives transistor Q17. Logic signal $SC_j$ drives transistor Q20. Signal RESET drives transistor Q18. Transistor Q20 is interposed between transistor Q19 and ground. Signal $SC_j$ drives transistor Q20. Transistor Q18 is also connected to ground.

The $L_w$ signal drives transistor $M_w$. The output of transistor $M_w$ is connected to the gates of both transistors $M_{ef}$ and $C_s$. Both the input and output of transistor $C_s$ are grounded. The output of transistor $M_{ef}$ is connected to the input of transistor $M_{wr}$. Signal $L_{wr}$ is connected to the gate of transistor $M_{wr}$.

Figure 5:
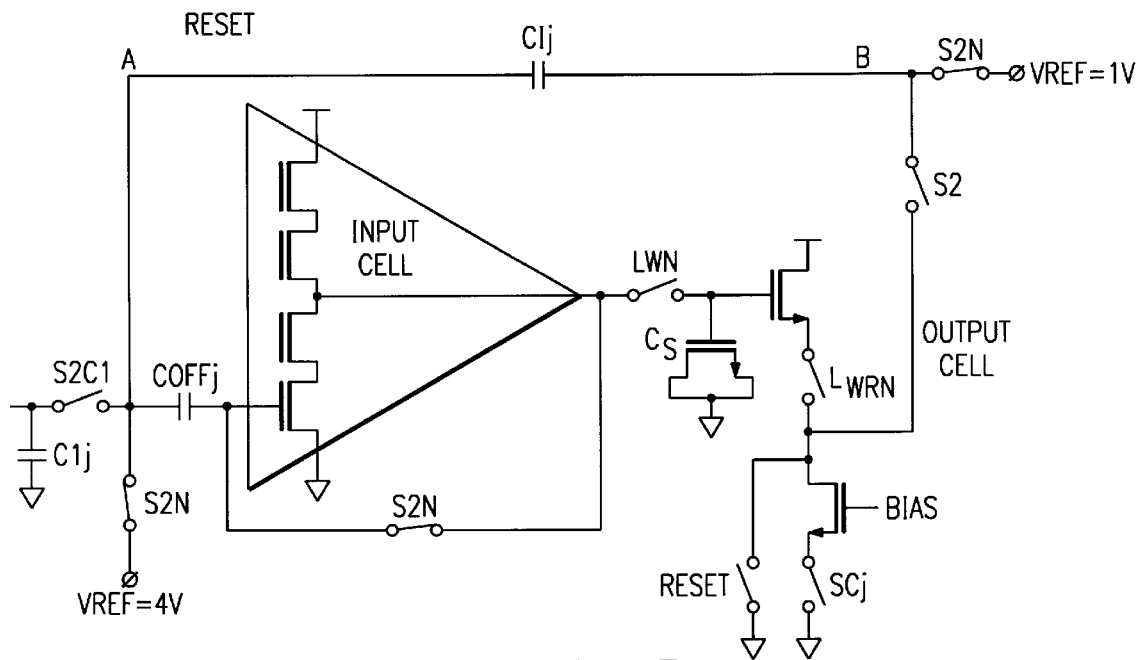
FIGS. 5 and 6 partially and schematically highlight the circuit configuration of FIG. 4 during a reset phase and during a phase of integration (transfer)
Figure 6:
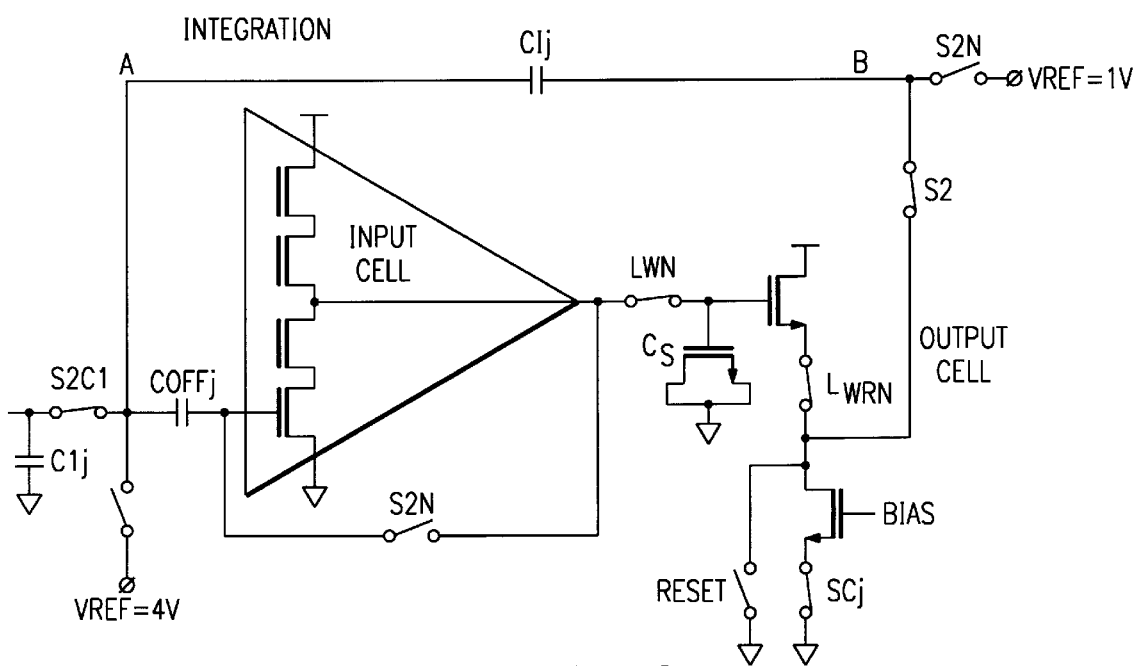

The configuration schemes of the integrating stage, during a reset phase and during an integration phase or writing phase of a selected cell of the relative column (j) are shown in FIGS. 5 and 6, respectively.

During a presampling phase of the analog input signal, the switches driven by the logic signals $S1_jC1$ for a first line or row of presampling capacitors $C1_j$ or $S1_jC2$ for the other line or row of presampling capacitors $C2_j$, are sequentially opened or closed at every clock front. This operation continues until sequentially storing the relative instantaneous values of the analog input signal on all the presampling capacitors of an entire line or row.

While the presampling of the analog input signal continues in a similar way on the second line or row of presampling capacitors, the values stored in the presampling capacitors of the first line are "written" in a parallel mode in the capacitive memory cells of a selected row of the memory matrix.

The capacitors $C1_j$ are used for writing on odd numbered rows of the memory matrix, whereas the presampling capacitors $C2_j$ are used for writing on even numbered rows of the memory.

In the considered example, presampling of a signal on an entire presampling line or row requires 176 clock cycles and an interval of four clock cycles before the presampling is resumed on the other line or row of presampling capacitors. If we consider a sampling clock frequency of the analog input signal equal to 2.5 MHz, the "writing" amplifier associated with each column of the memory matrix has at its disposal 72 $\mu$s for executing the writing of the cell of the corresponding selected memory row. As it can be observed, from this information, the speed performance of the "write" amplifier (integrator) does not constitute a particularly critical parameter.

The input writing speed may even be increased well beyond 2.5 MHz because it is exclusively limited by the time required by the signal presampling on the capacitors of one presampling line.

An integrating stage (charge amplifier) may be used as the "write" amplifier for each column of the memory matrix. The feedback integrating capacitor of the charge amplifier $CI_j$ may have the same value of the presampling capacitors, $C1_j$ and $C2_j$, which alternatively drive the amplifier input so as to make the gain of the stage equal to one. The use of an integrating stage rather than a unit gain buffer provides for a remarkable reduction of current consumption. In particular, in the case of the example shown, where the integrating stage is composed of a single branch cascode circuit, each cascode may be biased with a current of 1 $\mu$A.

Writing

The analog signal that corresponds to the scanning of a row of a photodiode optic sensor is stored on the presampling capacitors $C1_j$ (or $C2_j$) by closing $S1_jC1$ (or $S2_jC2$). The analog value pertaining to the scanning of the successive row of photodiodes will be stored on the capacitors $C2_j$ (or $C1_j$) of the other presampling row.

As it can be noted from the diagrams of FIGS. 5 and 6, during a reset phase, the initial conditions of the charge amplifiers (integrators) are reestablished while during an integration phase, the presampled signal stored on an input capacitor $C1_j$ is transferred (written) in the respective capacitive cell of the selected row of the memory matrix.

During the integration phase, supposing that the value Vin of the input analog signal was previously presampled on the capacitor $C1_j$, the logic signals S2C1, S2, $SC_j$ (where $1 \leq J \leq 176$) and $L_{wm}$ assume a high logic value, while the signal $L_{wn}$ assumes a low logic value. In this situation, assuming a starting condition whereby the node "A" of FIG. 4 is pre-loaded with a Vref1 voltage (4 volts) and the node "B" with a Vref2 voltage (1 volt), the integrating capacitor $CI_j$ charges to a voltage given by the difference between the Vref1 and Vref2 voltages, that is up to about 3 volts.

The writing starts when the switches S2C1, S2, $SC_j$, $L_{wr}$ and $L_w$ are closed and the switch S2N is opened. The loop closes and the node "A" assumes a low impedance. An electric charge whose value is equivalent to (Vref1−Vint) ·$C1_j$ flows in the integration capacitors $CI_j$. At the end of the writing phase the capacitor $C1_j$ charges itself up to the Vref1 voltage and the output voltage Vout assumes the following value:

$$Vout=(Vref1+Vref2-Vin)$$

In this way, even if there were some threshold differences amongst the different MOS transistors $M_{ef}$, they would be in any case compensated by the feedback loop.

Indeed, a charge information (Vout) equal to the result of the aforementioned equation incremented by the value of the gate/source voltage Vgs of the transistor $M_{ef}$ on $C_s$ is stored.

The reading of the stored information is carried out by biasing the respective column with a current identical to that used in the writing phase, therefore on the source node of $M_{ef}$ the above indicated equation remains verified.

According to preestablished conditions, the integration phase has 51.2 µs at its disposal for reaching completion.

During a reset phase, the above mentioned digital signals are inverted, the loop of the integrating stage opens and the information is retained in the capacitive cell $C_s$ in the form of an electric charge. On the contrary, the integrating capacitor $Ci_j$ and the presampling capacitor $CI_j$ are reset to the initial state of charge.

Reading

Reading may be carried out by stimulating eight adjacent columns (8 adjacent switches $SC_j$ being closed) and by selecting one row (high $L_{wr}$). By referring again to the diagram of FIG. 4, when a reading is being performed, the respective row $SC_j$ and the respective line $L_{wr}$ are in a high logic state, the j column is biased and the bias current flows through the reading amplifier constituted by the $M_{ef}$ transistor.

The analog value stored in the selected capacitive cell, less the emitter/gate voltage of the $M_{ef}$ transistor, is reproduced on the cell output node. This analog value can be readily made available externally through a normal analog buffer, capable of driving a relatively high (30 pf) capacitive load.

The output node (cell output) may normally be charged by a parasitic capacitance of about 1 pF. It is possible that during the reading of a cell, the output be precharged to a higher value than that of the selected cell. As a consequence, the current that was supposed to bias $M_{ef}$ is instead used for discharging the output. In case the difference between the voltage relative to the information stored in the selected cell and the precharge value is rather large, an excessive reading delay may result.

This drawback may be overcome by discharging the output node prior to each reading by means of an appropriate reset switch. In this way, the current necessary to charge the parasitic capacitance of the output node will be supplied by $M_{ef}$ with the resulting effect of increasing the reading speed.

In the example considered, the I/O characteristic of the memory is substantially linear within an output dynamic range comprised between 1 and 3 volts. This corresponds to an input dynamic range comprised approximately between 2 to 4 volts.

Figure 7:
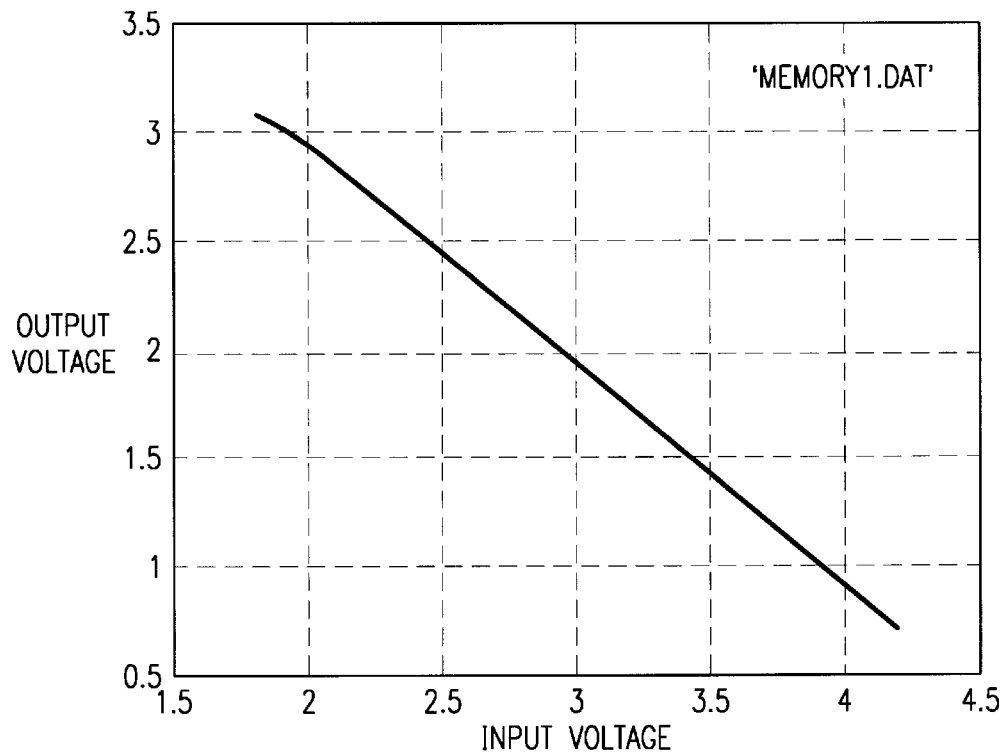
FIGS. 7, 8, 9 and 10 illustrate operating characteristics of a memory realized according to the present invention.

FIG. 7 shows the I/O characteristic of the memory. The data shown in the diagram of FIG. 5 refer to the average value calculated by taking into account all the memory cells. There exists a difference between the theoretical characteristic and the measured one. This is due to the phenomenon known with the name of "chargefeedthrough" that occurs during opening and closing of the cell select switches $M_w$. Moreover, offset and gain errors are introduced but these do not constitute a problem in view of the computational algorithm used.

Figure 8:
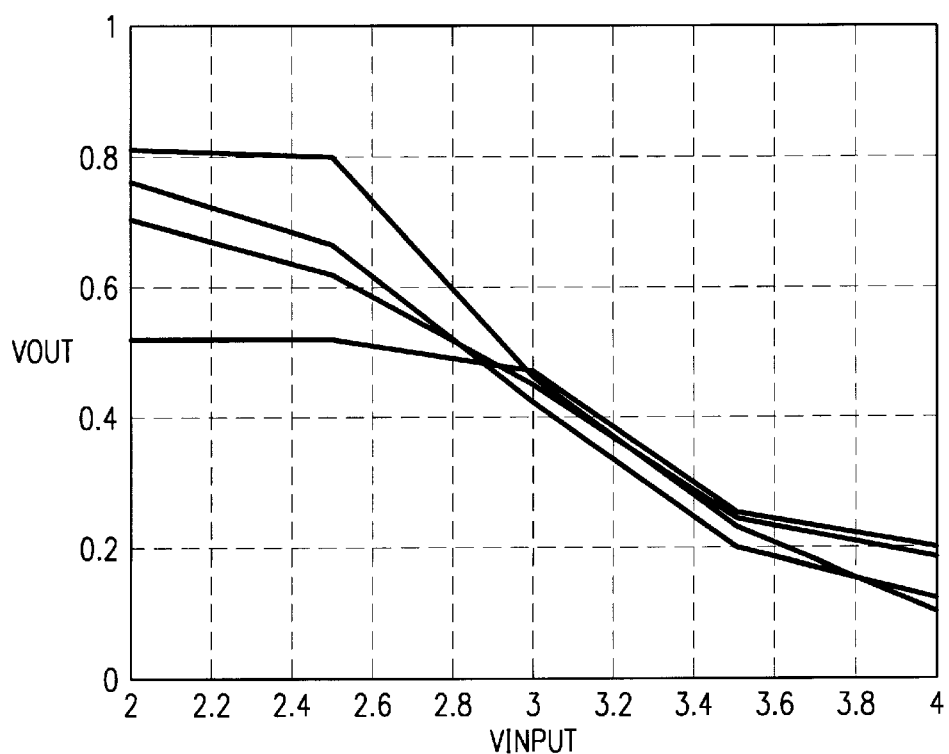

FIG. 8 shows the I/O characteristics of the memory when writing the same analog input value on all the memory cells and thereafter reading all the cells. The output value was determined by calculating the average of all the readings.

Figure 9:
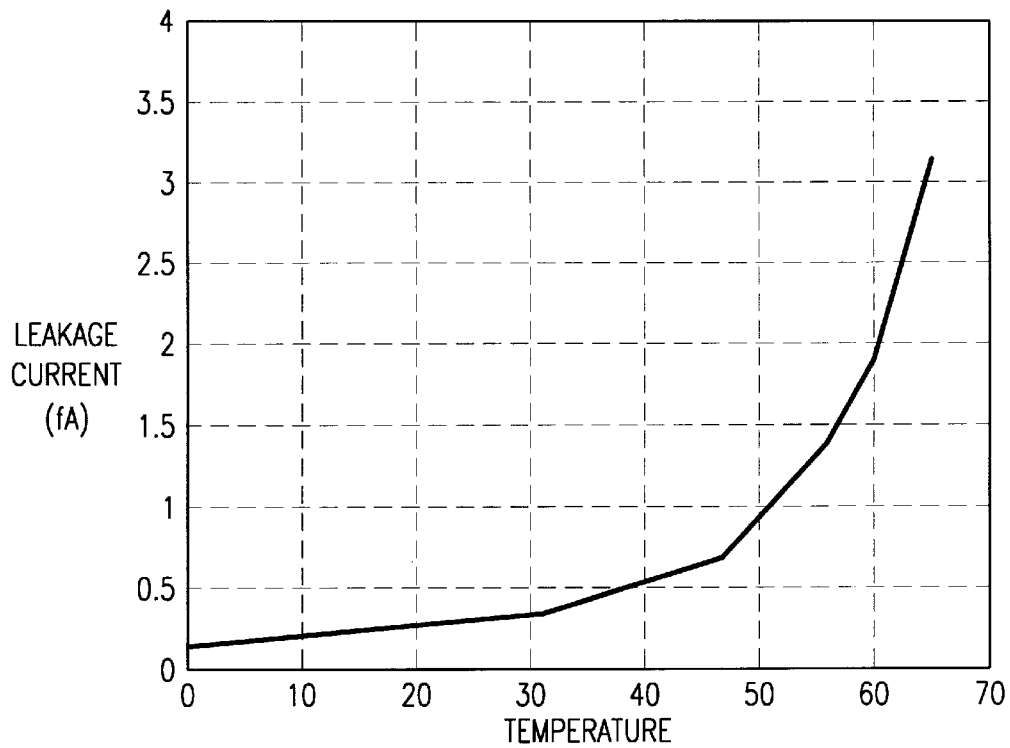

By referring to the described embodiment, another important verification carried out was that of determining the effect of the temperature on the leakage current through the drain and source (P±Nwell) junction of the $M_w$ switch. This effect is shown in the diagram of FIG. 9 and can be evaluated in terms of a voltage error of less than 6 mV for a temperature that remains lower than 65° C.

In terms of voltage, the error introduced by the leakage current after a retention period of 66 ms at a temperature of 27° C. is less than 1 mV and thus may be considered substantially negligible.

The output dynamic range is another parameter of importance. This is determined by writing the same analog value in all the memory cells and by reading the output value considering the cells as belonging to different windows, each of 16×16 pixels. In the sample realization of the memory of this invention a precision of 7 bits has been detected.

Figure 10:
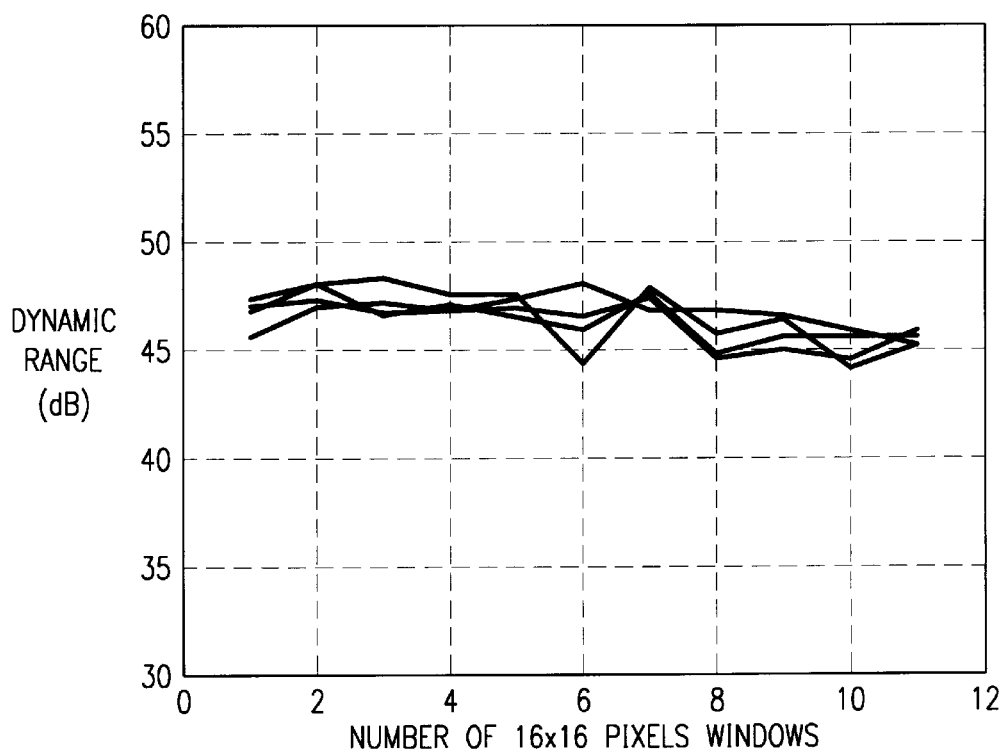

The detected data are diagrammatically shown in FIG. 10.

According to a disclosed class of innovative embodiments, there is provided an analog memory, comprising: an array of memory cells having a predetermined number of rows and columns, each of said cells having a storing capacitor; two rows of presampling capacitors, each of said rows of presampling capacitors having a number of capacitors equal to said predetermined number of columns of said array of memory cells, each of said rows of presampling capacitors being connected to alternatively pre-sample an input analog signal and transfer in a parallel mode into each of said cells of a selected row of said array of memory cells the presampled charge stored in said capacitors of one of said rows during a writing phase; and an integrating stage having an output coupled to one of said columns of said array of memory cells, and an input selectively driven by the presampled charge stored in one of said capacitors of one of said rows of presampling capacitors.

According to another disclosed class of innovative embodiments, there is provided an analog memory, comprising: an array of memory cells having a predetermined number of rows and columns, each of said cells having a storing capacitor; a first select switch connected to select one of said cells during a writing phase; a second select switch connected to select one of said cells during a reading phase and during said writing phase; a decoupling switch connected to avoid destruction of the information stored in said storing capacitor of said selected cell during said reading phase; two rows of presampling capacitors, each of said rows of presampling capacitors having a number of capacitors equal to said predetermined number of columns of said array of memory cells, each of said rows of presampling capacitors being connected to alternatively pre-sample an input analog signal and transfer in a parallel mode into each of said cells of a selected row of said array of memory cells the presampled charge stored in each of said capacitors of one of said rows during said writing phase; and an integrating stage having an output coupled to one of said columns of said array of memory cells, and an input selectively driven by the presampled charge stored in one of said capacitors of one of said rows of presampling capacitors.

According to another disclosed class of innovative embodiments, there is provided an analog memory, comprising: an array of memory cells having a predetermined number of rows and columns, each of said cells having a storing capacitor; two rows of presampling capacitors, each of said rows of presampling capacitors having a number of capacitors equal to said predetermined number of columns of said array of memory cells, each of said rows of presampling capacitors being connected to alternatively pre-sample an input analog signal and transfer in a parallel mode into each of said cells of a selected row of said array of memory cells the presampled charge stored in each of said capacitors of one of said rows during said writing phase; and an integrating stage having an output coupled to one of said columns of said array of memory cells, and an input selectively driven by the presampled charge stored in one of said capacitors of one of said rows of presampling capacitors, said integrating stage having a branch cascode stage which includes an integrating capacitor.

According to another disclosed class of innovative embodiments, there is provided an analog memory, comprising: an array of memory cells having a predetermined number of rows and columns, each of said cells having a storing capacitor; two rows of presampling capacitors, each of said rows of presampling capacitors having a number of capacitors equal to said predetermined number of columns of said array of memory cells, each of said rows of presampling capacitors being connected to alternatively presample an input analog signal and transfer in a parallel mode into each of said cells of a selected row of said array of memory cells the presampled charge stored in each of said capacitors of one of said rows during said writing phase; and an integrating stage having an output coupled to one of said columns of said array of memory cells, and an input selectively driven by the presampled charge stored in one of said capacitors of one of said rows of presampling capacitors, said integrating stage having a branch cascode stage which includes an integrating capacitor.

According to another disclosed class of innovative embodiments, there is provided: A method, comprising the steps of: (a) providing an array of memory cells having a predetermined number of rows and columns, each of said cells having a storing capacitor; (b) presampling an input analog signal on two rows of presampling capacitors, wherein the number of presampling capacitors of each row of presampling capacitors equals said predetermined number of columns of said array of memory cells; and (b) transferring the charge stored in each of the presampling capacitors of one of said rows of presampling capacitors in a parallel mode through an integrating stage into said storing capacitor of each of said cells of a selected row of said array of memory cells during a writing phase, while said input analog signal continues to be presampled on the other of said rows of presampling capacitors.

According to another disclosed class of innovative embodiments, there is provided an analog memory array of capacitive cells, organized in rows and columns, individually writable and readable in a nondestructive way of the stored information, comprising a pair of presampling capacitors associated to each column of said array, first capacitors of said pairs constituting a first presampling row and second capacitors of said pairs constituting a second presampling row; configuration means for storing instantaneous values of an analog input signal at successive presampling instants on the capacitors of one of said rows of presampling capacitors during the time interval in which presampled values stored in the capacitors of the other presampling row are written in a parallel mode in the corresponding cells of a selected row of said memory array.

According to another disclosed class of innovative embodiments, there is provided a method of writing in a parallel mode a capacitive cell analog memory, organized in rows and columns, comprising the steps of: presampling an analog input signal on two rows of presampling capacitors, each composed of the same number of capacitors of the columns of said array; writing each row of said array in a parallel mode, by transferring in the respective capacitive cells of the row the electric charge stored in corresponding presampling capacitors of one of said two rows, while the input signal continues to be presampled on the other row of capacitors.

According to another disclosed class of innovative embodiments, there is provided an optical sensor device comprising: an array of photodiodes arranged in rows and columns and individually addressable during a scan reading of the current photogenerated in each photodiode (pixel) and at least a storing analog memory of a scanned image comprising an array of capacitive cells, arranged in rows and columns, and individually writable and readable in a nondestructive way, characterized in that said array of photodiodes and said array of capacitive cells of said analog memory have an identical arrangement and number of rows and columns, said analog memory comprising a pair of presampling capacitors associated to each column of said array, first capacitors of said pairs constituting a first presampling row and second capacitors of said pairs constituting a second presampling row; configuration means for storing instantaneous values of an analog input signal, at successive presampling instants, on the capacitors of one of said rows of presampling capacitors during an interval of time in which presampled values stored in the capacitors of the other presampling row are written in the respective cells of one selected row of said memory array; the succession of detected analog values at the completion of the scanning of one line of said array of photodiodes being stored in one of said two rows of presampling capacitors and written in a parallel mode in a corresponding row of said analog memory during the scanning and the presampling of the analog values relative to a successive row of said array of photodiodes in the other row of said presampling capacitors.

Modifications and Variations

As will be recognized by those skilled in the art, the innovative concepts described in the present application can be modified and varied over a tremendous range of applications, and accordingly the scope of patented subject matter is not limited by any of the specific exemplary teachings given.

What is claimed is:

1. An analog memory, comprising:

an array of memory cells having a predetermined number of rows and columns, each of said cells having a storing capacitor;

two rows of presampling capacitors, each of said rows of presampling capacitors having a number of capacitors equal to said predetermined number of columns of said array of memory cells, each of said rows of presampling capacitors being connected to alternatively presample an input analog signal and transfer in a parallel mode into each of said cells of a selected row of said array of memory cells the presampled charge stored in said capacitors of one of said rows during a writing phase; and an integrating stage having an output coupled to one of said columns of said array of memory cells, and an input selectively driven by the presampled charge stored in one of said capacitors of one of said rows of presampling capacitors.

2. The memory of claim 1, wherein said integrating stage has a branch cascode stage which includes an integrating capacitor.

3. The memory of claim 1, wherein one of said rows of presampling capacitors is used for writing even numbered rows of said array of memory cells.

4. The memory of claim 1, wherein one of said rows of presampling capacitors is used for writing odd numbered rows of said array of memory cells.

5. The memory of claim 1, wherein said predetermined number of columns of said array is 176.

6. The memory of claim 1, wherein said predetermined number of rows of said array is 144.

7. The memory of claim 1, wherein said input analog signal is presampled by one of said rows of presampling capacitors at successive presampling instants equal to said predetermined number of columns before the other of said rows of presampling capacitors begins to pre-sample said input analog signal.

8. An analog memory, comprising:

an array of memory cells having a predetermined number of rows and columns, each of said cells having a storing capacitor;

a first select switch connected to select one of said cells during a writing phase;

a second select switch connected to select one of said cells during a reading phase and during said writing phase;

a decoupling switch connected to avoid destruction of the information stored in said storing capacitor of said selected cell during said reading phase;

two rows of presampling capacitors, each of said rows of presampling capacitors having a number of capacitors equal to said predetermined number of columns of said array of memory cells, each of said rows of presampling capacitors being connected to alternatively pre-sample an input analog signal and transfer in a parallel mode into each of said cells of a selected row of said array of memory cells the presampled charge stored in each of said capacitors of one of said rows during said writing phase; and an integrating stage having an output coupled to one of said columns of said array of memory cells, and an input selectively driven by the presampled charge stored in one of said capacitors of one of said rows of presampling capacitors.

9. The memory of claim 8, wherein said integrating stage has a branch cascode stage which includes an integrating capacitor.

10. The memory of claim 8, wherein one of said rows of presampling capacitors is used for writing even numbered rows of said array of memory cells.

11. The memory of claim 8, wherein one of said rows of presampling capacitors is used for writing odd numbered rows of said array of memory cells.

12. The memory of claim 8, wherein said predetermined number of columns of said array is 176.

13. The memory of claim 8, wherein said predetermined number of rows of said array is 144.

14. The memory of claim 8, wherein said input analog signal is presampled by one of said rows of presampling capacitors at successive presampling instants equal to said predetermined number of columns before the other of said rows of presampling capacitors begins to pre-sample said input analog signal.

15. An analog memory, comprising:

an array of memory cells having a predetermined number of rows and columns, each of said cells having a storing capacitor;

two rows of presampling capacitors, each of said rows of presampling capacitors having a number of capacitors equal to said predetermined number of columns of said array of memory cells, each of said rows of presampling capacitors being connected to alternatively pre-sample an input analog signal and transfer in a parallel mode into each of said cells of a selected row of said array of memory cells the presampled charge stored in each of said capacitors of one of said rows during said writing phase; and an integrating stage having an output coupled to one of said columns of said array of memory cells, and an input selectively driven by the presampled charge stored in one of said capacitors of one of said rows of presampling capacitors, said integrating stage having a branch cascode stage which includes an integrating capacitor.

16. The memory of claim 15, wherein one of said rows of presampling capacitors is used for writing even numbered rows of said array of memory cells.

17. The memory of claim 15, wherein one of said rows of presampling capacitors is used for writing odd numbered rows of said array of memory cells.

18. The memory of claim 15, wherein said predetermined number of columns of said array is 176.

19. The memory of claim 15, wherein said predetermined number of rows of said array is 144.

20. The memory of claim 15, wherein said input analog signal is presampled by one of said rows of presampling capacitors at successive presampling instants equal to said predetermined number of columns before the other of said rows of presampling capacitors begins to pre-sample said input analog signal.

21. A method, comprising the steps of:

(a.) providing an array of memory cells having a predetermined number of rows and columns, each of said cells having a storing capacitor;

(b.) presampling an input analog signal on two rows of presampling capacitors, wherein the number of presampling capacitors of each row of presampling capacitors equals said predetermined number of columns of said array of memory cells; and (c.) transferring the charge stored in each of the presampling capacitors of one of said rows of presampling capacitors in a parallel mode through an integrating stage into said storing capacitor of each of said cells of a selected row of said array of memory cells during a writing phase, while said input analog signal continues to be presampled on the other of said rows of presampling capacitors.

22. The method of claim 21, wherein said integrating stage has a branch cascode stage which includes an integrating capacitor.

23. The method of claim 21, wherein one of said rows of presampling capacitors is used for writing even numbered rows of said array of memory cells.

24. The method of claim 21, wherein one of said rows of presampling capacitors is used for writing odd numbered rows of said array of memory cells.

25. The method of claim 21, wherein said predetermined number of columns of said array is 176.

26. The method of claim 21, wherein said predetermined number of rows of said array is 144.

27. The method of claim 21, wherein said input analog signal is presampled by one of said rows of presampling capacitors at successive presampling instants equal to said predetermined number of columns before the other of said rows of presampling capacitors begins to pre-sample said input analog signal.

28. An analog memory array of capacitive cells, organized in rows and columns, individually writable and readable in a nondestructive way of the stored information, comprising a pair of presampling capacitors associated to each column of said array, first capacitors of said pairs constituting a first presampling row and second capacitors of said pairs constituting a second presampling row;

configuration means for storing instantaneous values of an analog input signal at successive presampling instants on the capacitors of one of said rows of presampling capacitors during the time interval in which presampled values stored in the capacitors of the other presampling row are written in a parallel mode in the corresponding cells of a selected row of said memory array.

29. The analog memory according to claim 28, characterized in that it comprises a resettable charge integrating stage having an output coupled to a respective column of said array, constituted by a differential amplifier feedback by an integrating capacitor and whose input is selectively driven by the charge stored either in one or the other capacitor of a respective pair of presampling capacitors, during a writing phase of a cell of said array.

30. The analog memory according to claim 29, characterized in that said charge integrating stage comprises a one branch cascode circuit.

31. The analog memory according to claim 29, characterized in that said integrating capacitor has the same capacitance of said presampling capacitors.

32. A method of writing in a parallel mode a capacitive cell analog memory, organized in rows and columns, comprising the steps of:

presampling an analog input signal on two rows of presampling capacitors, each composed of the same number of capacitors of the columns of said array;

writing each row of said array in a parallel mode, by transferring in the respective capacitive cells of the row the electric charge stored in corresponding presampling capacitors of one of said two rows, while the input signal continues to be presampled on the other row of capacitors.

33. The method according to claim 32, characterized in that the writing in a parallel mode of each capacitive cell of one row is performed by means of a single branch cascode integrating stage, feedback by an integrating capacitor, associated to each column of said array and selectively driven by the electric charge stored in the presampling capacitors of said two rows.

\* \* \* \* \*